(12) United States Patent
Yoshida et al.

(10) Patent No.: US 12,477,762 B2
(45) Date of Patent: Nov. 18, 2025

(54) SEMICONDUCTOR DEVICE

(71) Applicant: Mitsubishi Electric Corporation, Tokyo (JP)

(72) Inventors: Kentaro Yoshida, Tokyo (JP); Koichiro Kisu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 564 days.

(21) Appl. No.: 17/906,783

(22) PCT Filed: May 21, 2020

(86) PCT No.: PCT/JP2020/020031
§ 371 (c)(1),
(2) Date: Sep. 20, 2022

(87) PCT Pub. No.: WO2021/234883
PCT Pub. Date: Nov. 25, 2021

(65) Prior Publication Data
US 2023/0155012 A1 May 18, 2023

(51) Int. Cl.
*H10D 12/00* (2025.01)
*H01L 23/00* (2006.01)
*H10D 64/23* (2025.01)

(52) U.S. Cl.
CPC ........... *H10D 12/411* (2025.01); *H01L 24/32* (2013.01); *H01L 24/33* (2013.01); *H01L 24/48* (2013.01);
(Continued)

(58) Field of Classification Search
CPC ... H01L 2224/02166; H01L 2224/0603; H01L 2224/06181; H01L 2224/48091;
(Continued)

(56) References Cited

U.S. PATENT DOCUMENTS 8,633,550 B2 * 1/2014 Uno ..................... H10D 30/669
257/365
9,905,652 B2 * 2/2018 Nishimura .............. H01L 24/48
(Continued)

FOREIGN PATENT DOCUMENTS

CN 110612600 A 12/2019
JP 2010-263032 A 11/2010
(Continued)

OTHER PUBLICATIONS

An Office Action; "Notice of Reasons for Refusal," mailed by the Japanese Patent Office on Mar. 22, 2023, which corresponds to Japanese Patent Application No. 2022-524780 and is related to U.S. Appl. No. 17/906,783; with English language translation.
(Continued)

*Primary Examiner* — Jermele M Hollington
*Assistant Examiner* — Zannatul Ferdous
(74) *Attorney, Agent, or Firm* — Studebaker Brackett PLLC

(57) ABSTRACT

The semiconductor device according to the present disclosure has features (1) to (3) below. The feature (1) is that "a lower surface of an on-chip bonding material has a shape matching a surface shape of a main current wiring connection region in plan view". The feature (2) is that "an emitter sense wiring is directly connected to a side surface of the main current wiring connection region". The feature (3) is that "an IGBT chip has an ineffective region in which the IGBT does not function in a region below an emitter sense pad and the emitter sense wiring".

6 Claims, 11 Drawing Sheets

(52) U.S. Cl.
CPC .............. *H01L 24/49* (2013.01); *H01L 24/73* (2013.01); *H01L 2224/3201* (2013.01); *H01L 2224/32245* (2013.01); *H01L 2224/3303* (2013.01); *H01L 2224/48011* (2013.01); *H01L 2224/48245* (2013.01); *H01L 2224/4903* (2013.01); *H01L 2224/73215* (2013.01); *H01L 2224/73265* (2013.01); *H01L 2924/13055* (2013.01); *H10D 64/231* (2025.01)

(58) Field of Classification Search
CPC . H01L 2224/48464; H01L 2224/49111; H01L 2224/49175; H01L 24/06; H01L 2924/00014; H01L 24/32; H01L 24/33; H01L 24/48; H01L 24/49; H01L 24/73; H01L 2224/3201; H01L 2224/32245; H01L 2224/3303; H01L 2224/48011; H01L 2224/48245; H01L 2224/4903; H01L 2224/73215; H01L 2224/73265; H01L 2924/13055; H10D 64/231; H10D 12/441; H10D 12/411
See application file for complete search history.

(56) References Cited

U.S. PATENT DOCUMENTS

| | | |
|---|---|---|
| 2013/0049137 A1 | 2/2013 | Uno et al. |
| 2015/0206830 A1* | 7/2015 | Takada .................. H01L 21/561 257/676 |
| 2017/0098647 A1* | 4/2017 | Uchida .................. H10D 30/63 |
| 2017/0111037 A1* | 4/2017 | Shiigi .................. H10D 84/401 |
| 2020/0116780 A1* | 4/2020 | Kawahara ............... H01L 24/06 |

FOREIGN PATENT DOCUMENTS

| | | |
|---|---|---|
| JP | 2013-045996 A | 3/2013 |
| WO | 2018/211735 A1 | 11/2018 |

OTHER PUBLICATIONS

An Office Action; mailed by the China National Intellectual Property Administration of the People's Republic of China on Dec. 31, 2024, which corresponds to Chinese Patent Application No. 202080101008.0 and is related to U.S. Appl. No. 17/906,783.
International Search Report issued in PCT/JP2020/020031; mailed Jul. 21, 2020.

* cited by examiner

F I G. 2
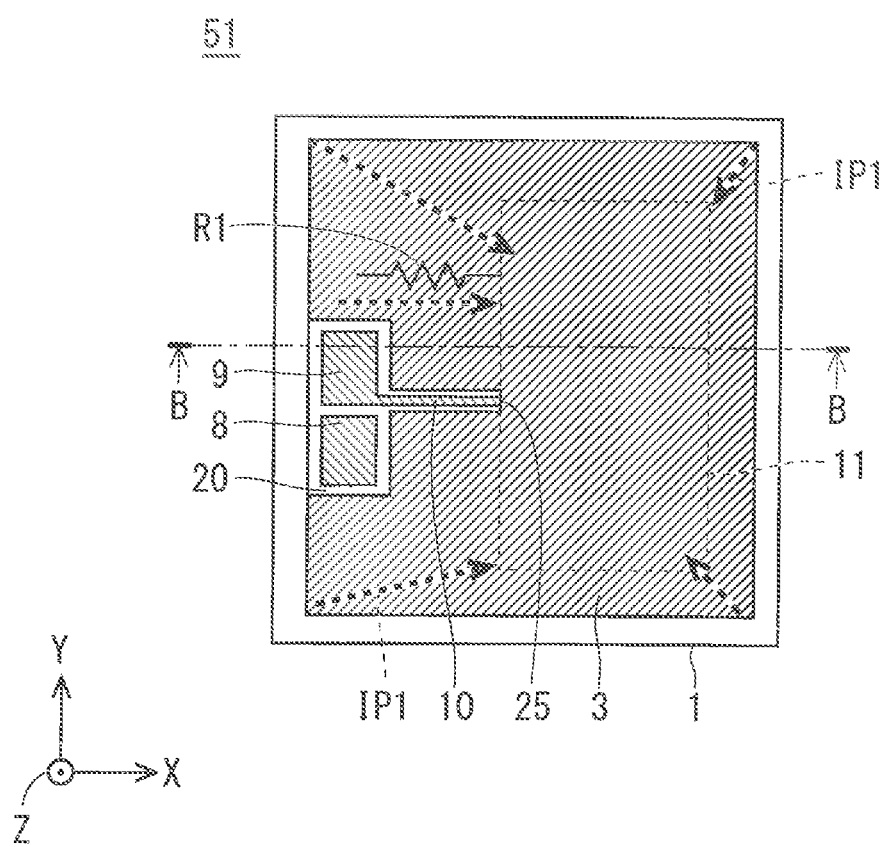

F I G. 3
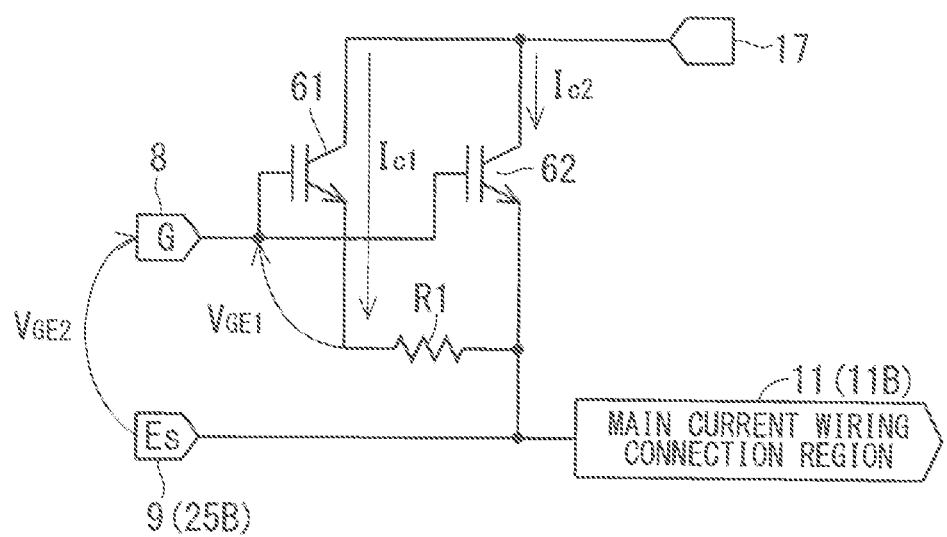

F I G. 8
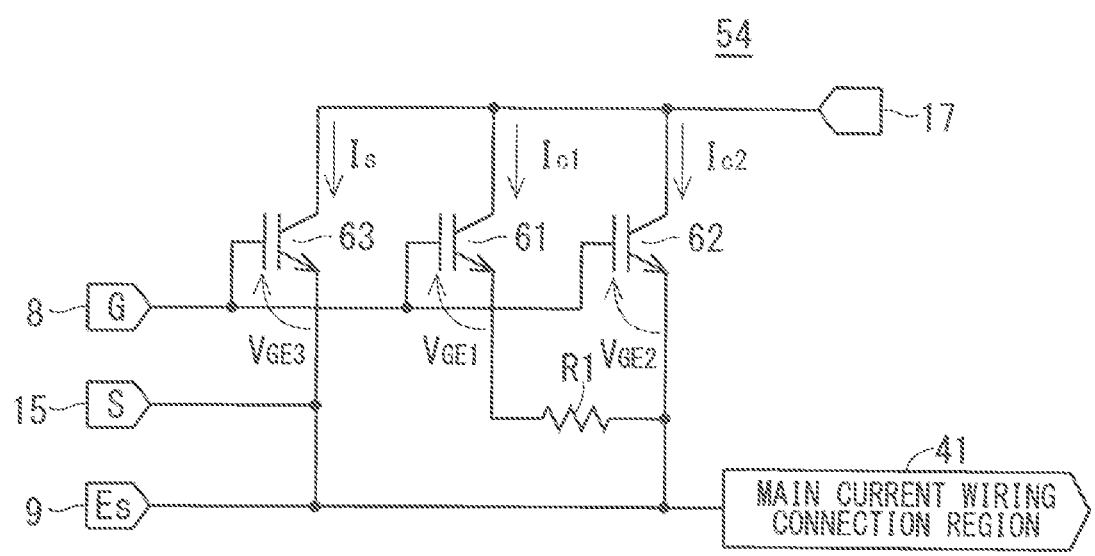

SEMICONDUCTOR DEVICE

TECHNICAL FIELD

The present disclosure relates to a semiconductor device including a semiconductor chip having a switching element in the inside.

BACKGROUND ART

As a semiconductor device for electric power, a semiconductor device including a semiconductor chip having a switching element such as an insulated gate bipolar transistor (IGBT) or a metal-oxide-semiconductor field effect transistor (MOSFET) in the inside is generally used.

Examples of a conventional power semiconductor device include a semiconductor device disclosed in Patent Document 1.

PRIOR ART DOCUMENT

Patent Document

Patent Document 1: Japanese Patent Application Laid-Open No. 2013-45996

SUMMARY

Problem to be Solved by the Invention

In a conventional power semiconductor device, an IGBT has been used as a switching element, and potential obtained from an outer peripheral region of an emitter electrode has been used as emitter potential serving as reference potential of gate voltage serving as control voltage for operating and controlling the IGBT in an IGBT chip.

On the other hand, a wiring connection region provided in a central portion of an emitter electrode is generally electrically connected to an external terminal, and current flowing through a wiring connection region is main current.

Ideally, potential in an emitter electrode surface is constant, but since an emitter electrode has a minute resistance component, when current flows through an IGBT, distribution occurs in potential in a plane of the emitter electrode.

Therefore, in the conventional semiconductor device, main current tends to increase according to potential distribution in a plane of an emitter electrode. In particular, when large current flows due to short circuit or the like as main current, the above-described tendency becomes remarkable, and thus there has been a problem that an IGBT chip may be thermally broken due to increase in main current of an IGBT.

The present disclosure has been made to solve the above problem, and an object of the present disclosure is to provide a highly reliable semiconductor device.

Means to Solve the Problem

A first aspect of a semiconductor device according to the present disclosure provides a semiconductor chip having a switching element therein, and a surface electrode provided on a surface of the semiconductor chip and through which main current flows during operation of the switching element, in which the switching element has a control electrode, and the switching element is operated and controlled by applying a control voltage with potential of the surface electrode as reference potential to the control electrode, the semiconductor device further including an insulating film provided on the surface electrode, in which the insulating film has an opening region, and a region in the opening region in the surface electrode serves as a wiring connection region, the semiconductor device further including a chip bonding material that has a lower surface and is electrically connected to the surface electrode by contacting the lower surface with a surface of the wiring connection region, a sense pad provided in a manner being in contact with the surface electrode on a surface of the semiconductor chip, and a sense wiring provided on a surface of the semiconductor chip and electrically connecting the surface electrode and the sense pad, in which potential of the sense pad is control reference potential of the switching element, the lower surface of the chip bonding material has a shape matching a surface shape of the wiring connection region in plan view, the sense wiring is connected to the wiring connection region, and the semiconductor chip has an ineffective region in which the switching element does not function in a region below the sense pad and the sense wiring.

A second aspect of the semiconductor device according to the present disclosure provides a semiconductor chip having a switching element therein, and a surface electrode provided on a surface of the semiconductor chip and through which main current flows during operation of the switching element, in which the switching element has a control electrode, and the switching element is operated and controlled by applying a control voltage with potential of the surface electrode as reference potential to the control electrode, a chip wire that is electrically connected to the surface electrode by contacting at a chip connection point on a surface of the surface electrode, and a sense connection member that is electrically connected to the surface electrode by contacting at a sense connection point of the surface electrode, potential of the sense connection point is control reference potential of the switching element, a region including the chip connection point in the surface electrode is defined as a wiring connection region, and a position farthest from the wiring connection region in the surface electrode is defined as an electrode remote position, and the sense connection point satisfies a connection point arrangement condition that a connection point is provided at a position close to the chip connection point between the chip connection point and the electrode remote position.

Effects of the Invention

The first aspect of the semiconductor device of the present disclosure has features (1) to (3) below.
(1) The lower surface of the chip bonding material has a shape matching a surface shape of the wiring connection region in plan view.
(2) The sense wiring is connected to the wiring connection region.
(3) The semiconductor chip has an ineffective region in which the switching element does not function in a region below the sense pad and the sense wiring.

Since the first aspect of the semiconductor device of the present disclosure has the above-described features (1) to (3), control reference potential during operation of the switching element is not affected by a resistance component based on a distance from the wiring connection region.

On the other hand, in the surface electrode of the first aspect, remote region reference potential, which is potential in a surface electrode remote region relatively away from the wiring connection region, is affected by a resistance component based on a distance from the wiring connection region, and has a reference potential fluctuation characteristic in which potential fluctuates from the control reference potential.

Therefore, according to the first aspect of the semiconductor device of the present disclosure, when large current flows as main current of the surface electrode at the time of a short circuit or the like, an amount of current flowing in the surface electrode remote region can be reduced according to the reference potential fluctuation characteristic.

As a result, according to the fast aspect of the semiconductor device of the present disclosure, increase in an amount of the main current can be effectively suppressed by reducing an amount of current flowing through the surface electrode remote region, and reliability of the device can be improved.

The second aspect of the semiconductor device of the present disclosure has a feature (4) below.

(4) The sense connection point satisfies the connection point arrangement condition that the connection point is provided at a position close to the chip connection point between the chip connection point and the electrode remote position.

The second aspect of the semiconductor device of the present disclosure has the above feature (4), and by arranging the sense connection point close to the chip connection point, the control reference potential during operation of the switching element is hardly affected by a resistance component based on a distance from the wiring connection region.

On the other hand, in the surface electrode of the second aspect, the remote region reference potential, which is a potential in the surface electrode remote region relatively away from the wiring connection region, has a reference potential fluctuation characteristic in which potential fluctuates from the control reference potential under the influence of the resistance component based on the distance from the wiring connection region.

Therefore, according to the second aspect of the semiconductor device of the present disclosure, when large current flows as main current of the surface electrode at the time of a short circuit or the like, an amount of current flowing in the surface electrode remote region can be reduced according to the reference potential fluctuation characteristic.

As a result, according to the second aspect of the semiconductor device of the present disclosure, increase in an amount of the main current can be effectively suppressed by reducing an amount of current flowing through the surface electrode remote region, and reliability of the device can be improved.

An object, a feature, an aspect, and an advantage of the present disclosure will become clearer from detailed description below and the accompanying drawings.

BRIEF DESCRIPTION OF DRAWINGS

FIG. 2 is an explanatory diagram illustrating a structure of the semiconductor device of the first embodiment.

FIG. 3 is a circuit diagram showing an equivalent circuit of the semiconductor device of the first embodiment.

FIG. 8 is a circuit diagram illustrating the equivalent circuit of the fourth embodiment.

DESCRIPTION OF EMBODIMENTS

<Basic Technique>

Figure 9:
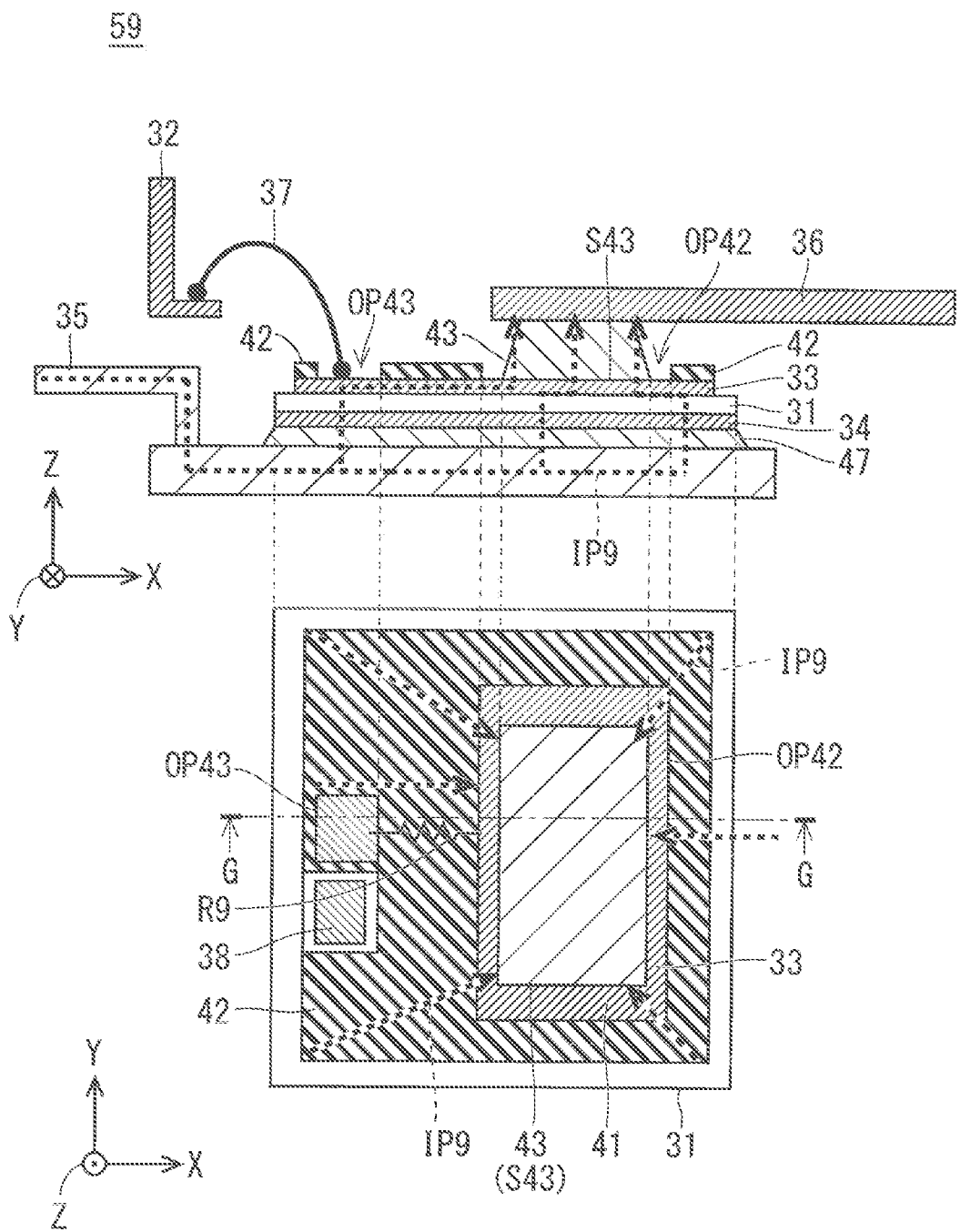
FIG. 9 is an explanatory diagram illustrating a structure of a semiconductor device as a basic technique.

FIG. 9 is an explanatory diagram illustrating a structure of a semiconductor device as a basic technique. An upper diagram of FIG. 9 is a cross-sectional view, and a lower diagram is a plan view. A cross section taken along line G-G of the lower diagram is the upper diagram. An XYZ orthogonal coordinate system is illustrated in the upper diagram and the lower diagram of FIG. 9. In the lower diagram of FIG. 9, an insulating film 42 is illustrated as an uppermost layer.

In a semiconductor device 59 illustrated in FIG. 9, an IGBT is used as a switching element, and an IGBT chip 31 which is a semiconductor chip having the IGBT in the inside is packaged.

As illustrated in FIG. 9, an emitter electrode 33 is provided on a front surface of the IGBT chip 31, and a collector electrode 34 is provided on a back surface. The collector electrode 34 as a back surface electrode is electrically connected to a main current wiring 35 via a sub-chip bonding material 47 below.

The insulating film 42 is provided on a front surface of the emitter electrode 33 which is a front surface electrode. The insulating film 42 has an opening region OP42 from the center in the +X direction. The opening region OP42 has a rectangular shape in which the length in the Y direction is longer than the length in the X direction in plan view.

The insulating film 42 further includes an opening region OP43 in an outer peripheral portion on the −X direction side on a surface of the IGBT chip 31. The opening region OP43 has a rectangular shape in which the length in the Y direction is slightly longer than the length in the X direction in plan view, and has a smaller formation area than the opening region OP42.

In the emitter electrode 33, a region in the opening region OP42 is a main current wiring connection region 41, and a region in the opening region OP43 is an emitter sense region.

An on-chip bonding material 43 is provided on a partial region at the center of the main current wiring connection region 41. That is, a lower surface S43 of the on-chip bonding material 43 and a part of a surface region of the main current wiring connection region 41 come into contact with each other, so that an emitter electrode 3 and the on-chip bonding material 43 are electrically connected. Note that a formation area of the lower surface S43 of the on-chip bonding material 43 is smaller than a surface area of the main current wiring connection region 41.

A main current wiring 36 is provided on the on-chip bonding material 43, and the main current wiring 36 and the on-chip bonding material 43 are electrically connected.

As illustrated in the upper diagram of FIG. 9, an emitter sense region of the emitter electrode 33 existing in the opening region OP43 is electrically connected to a control terminal 32 via a control wire 37.

A gate pad 38 is electrically connected to a gate electrode which is a control electrode of an IGBT (not illustrated), is independently provided on a surface of the IGBT chip 31 without being in contact with the emitter electrode 33, and has an exposed surface.

The gate pad 38 is electrically connected to a gate control terminal (not illustrated) via a gate control wire (not illustrated).

As described above, the control terminal 32 for the emitter electrode 33 and the gate control terminal exist as the control terminal of the 1013T.

Al or the like is used as a constituent material of the control wire 37 and the gate control wire, and an emitter sense pad (not illustrated) is generally provided on an emitter sense region in the opening region OP43 in order to electrically connect the control wire 37 and the collector electrode 34. That is, by bonding the control wire 37 to a surface of the emitter sense pad, the emitter sense region of the emitter electrode 33 and the control terminal 32 can be electrically connected via the emitter sense pad and the control wire 37. Similarly to the control wire 37, the gate control wire is bonded onto a surface of the gate pad 38.

The main current wiring 36 is electrically connected to the main current wiring 35 via the on-chip bonding material 43, the emitter electrode 33, the IGBT in the IGBT chip 31, the collector electrode 34, and the sub-chip bonding material 47.

Therefore, in the semiconductor device 59, main current flows from the main current wiring 35 to the main current wiring 36 during operation of the IGBT. The main current wirings 35 and 36 are external wirings for extracting main current flowing through the IGBT. A current path IP9 illustrated in FIG. 9 indicates current flow in the main current.

As described above, the gate pad 38 and the emitter sense pad are generally provided in an outer peripheral portion of the IGBT chip 31 in consideration of connectivity with a module. That is, the emitter sense pad is provided on an outer peripheral region of the emitter electrode 33.

Figure 10:
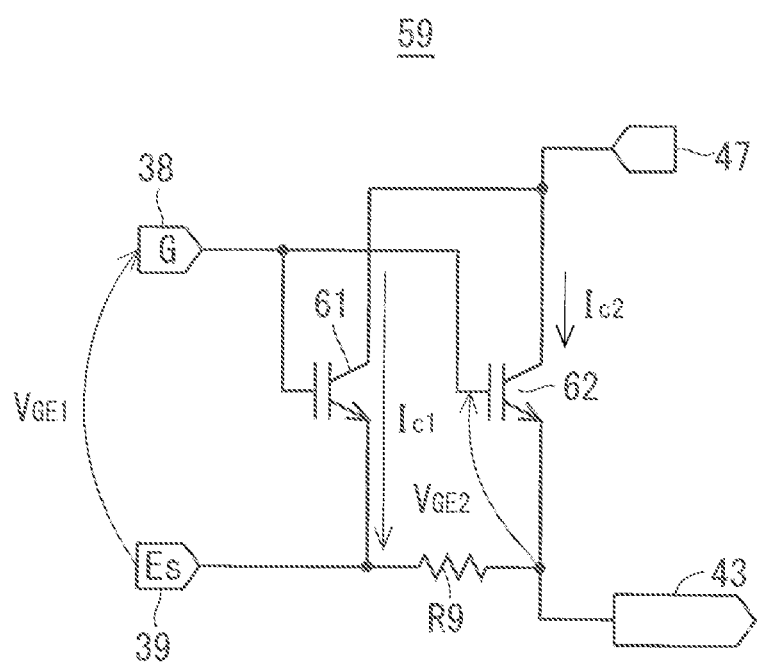
FIG. 10 is a circuit diagram illustrating the equivalent circuit of the semiconductor device illustrated in FIG. 9.

FIG. 10 is a circuit diagram illustrating an equivalent circuit of the semiconductor device 59 illustrated in FIG. 9. In FIG. 10, a resistance component of the emitter electrode 33 is considered. Note that, in FIG. 10, "39" means the above-described emitter sense pad. Further, in FIG. 10, the gate pad 38 is indicated by "G", and the emitter sense pad 39 is indicated by "Es".

Actually, a resistance component of the emitter electrode 33 is distributed in all the emitter electrodes 33 except for a region bonded to the on-chip bonding material 43, but for simplification, in FIG. 10, the resistance component is considered as an emitter electrode resistance component R9 with a lumped constant. That is, the IGBTs in the IGBT chip 31 are classified into two, the IGBT in which collector current Ic2 flows in the main current wiring connection region 41 and the vicinity of the main current wiring connection region 41 is an IGBT 62, and the IGBT in which collector current Ic1 flows in an outer peripheral region of the emitter electrode 3 away from a main current wiring connection region 11 is an IGBT 61. Note that the emitter sense pad 39 is provided in an outer peripheral region of the emitter electrode 3.

Therefore, as illustrated in FIG. 10, the collectors of the IGBTs 61 and 62 are connected in common to the sub-chip bonding material 47, and the gates of the IGBTs 61 and 62 are connected in common to the gate pad 38.

On the other hand, the emitter of the IGBT 62 is connected to the on-chip bonding material 43, and the emitter of the IGBT 61 is connected to the emitter sense pad 39. The emitter electrode resistance component R9 exists between the emitters of the IGBTs 61 and 62.

The emitter electrode resistance component R9 is a resistance component based on a distance from a lower surface of the on-chip bonding material 43 to the emitter sense pad 39 in the emitter electrode 33.

In the semiconductor device 59 having such a configuration, gate voltage VGE1 is applied between the gate pad 38 and the emitter sense pad 39 to put the IGBT in the IGBT chip 31 into an operating state.

When the IGBT is in an on state, the collector current Ic1 flows through the IGBT 61, and the collector current Ic2 flows through the IGBT 62.

Since the emitter electrode resistance component R9 exists between the emitters of the IGBTs 61 and 62, emitter potential of the IGBT 62 becomes lower than emitter potential of the IGBT 61 due to voltage drop by the emitter electrode resistance component R9.

As a result, as shown in Equation (1) below, gate voltage VGE2 of the IGBT 62 becomes higher than the gate voltage VGE1.

$$VGE2=VGE1+R9 \cdot Ic1 \tag{1}$$

In Equation (1), "R9" is used as a resistance value of the emitter electrode resistance component R9, and "Ic2" is used as a current value of the collector current Ic2.

As described above, the collector current Ic2 in the semiconductor device 59 tends to increase in accordance with potential distribution in a plane of the emitter electrode 33. In particular, when large current flows through the IGBT due to short circuit or the like, this tendency becomes remarkable, and thus there has been possibility that the IGBT chip 31 is thermally broken due to increase in the collector current Ic2.

As described above, the semiconductor device 59 as a basic technique has a problem of low reliability.

On the other hand, in the semiconductor device disclosed in Patent Document 1, focusing on a resistance component of a source electrode corresponding to the emitter electrode 33, potential of a pad for a source sense is changed from a conventional structure to reduce output variation of a current detection element built in a switching element. However, improvement in reliability of the semiconductor device disclosed in Patent Document 1 has been insufficient.

Embodiments described below are intended to solve a problem of the basic technique represented by the semiconductor device 59.

First Embodiment

Figure 1:
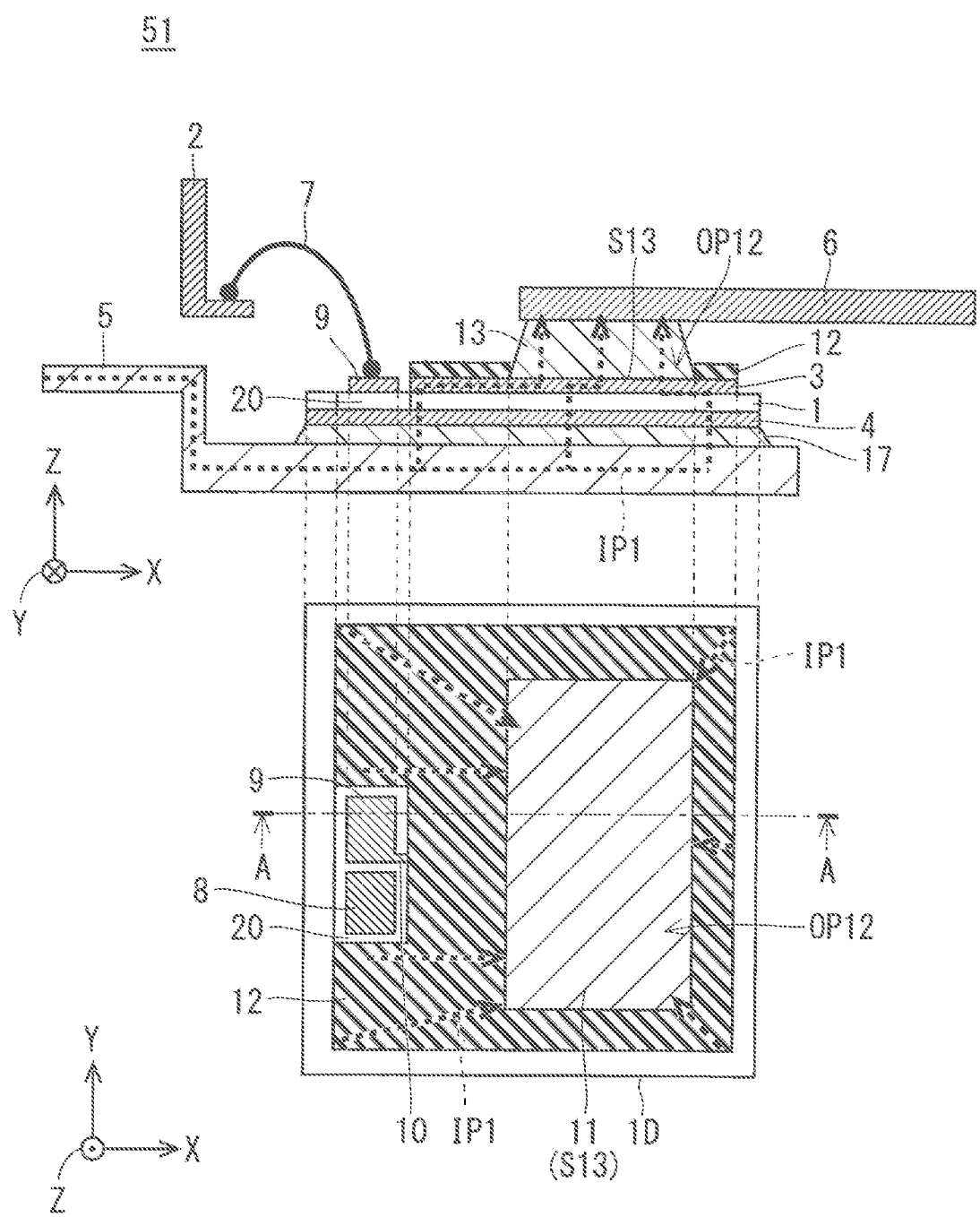
FIG. 1 is an explanatory diagram illustrating a structure of a semiconductor device according to a first embodiment.

FIGS. 1 and 2 are explanatory diagrams illustrating a structure of a semiconductor device 51 according to a first embodiment of the present disclosure. An upper diagram of FIG. 1 is a cross-sectional view, and a lower diagram is a plan view, and FIG. 2 is a plan view. A cross section taken along line A-A of the lower diagram of FIG. 1 is the upper diagram of FIG. 1, and a cross section taken along line B-B of FIG. 2 is also the upper diagram of FIG. 1. An XYZ orthogonal coordinate system is illustrated in the upper diagram and the lower diagram of FIG. 1, and FIG. 2.

The lower diagram of FIG. 1 is a plan view in which an uppermost part is an insulating film 12, and FIG. 2 is a plan view in which an uppermost part is the emitter electrode 3.

In the semiconductor device 51 illustrated in FIGS. 1 and 2, an IGBT is used as a switching element, and an IGBT chip 1 which is a semiconductor chip having the IGBT in the inside is packaged.

As illustrated in FIGS. 1 and 2, the emitter electrode 3 is provided on a surface of the IGBT chip 1. The emitter electrode 3 is formed in most of a region on a surface of the IGBT chip 1 except for a formation region of a gate pad 8, an emitter sense pad 9, and an emitter sense wiring 10.

The collector electrode 4 is provided on a back surface of the IGBT chip 1. The collector electrode 4 as a back surface electrode is electrically connected to a main current wiring 5 via a sub-chip bonding material 17 provided below. In the main current wiring 5, a base is below the sub-chip bonding material 17.

The insulating film 12 is provided on a surface of the emitter electrode 3. The insulating film 12 has an opening region OP12 from the center in the +X direction. The opening region OP12 has a rectangular shape in which the length in the Y direction is longer than the length in the X direction in plan view.

The insulating film 12 functions as a protective film, and is formed, for example, by applying polyimide onto a surface of the emitter electrode 3.

In the emitter electrode 3, a region in the opening region OP12 is the main current wiring connection region 11.

An on-chip bonding material 13 is provided on the entire region of the main current wiring connection region 11. A lower surface S13 of the on-chip bonding material 13 has a shape matching a surface shape of the main current wiring connection region 11 in plan view. The on-chip bonding material 13 corresponds to the "chip bonding material".

By contacting the lower surface S13 of the on-chip bonding material 13 with a surface of the main current wiring connection region 11, the on-chip bonding material 13 is electrically connected to the emitter electrode 3. Therefore, the on-chip bonding material 13 is provided on the entire region of a surface of the main current wiring connection region 11.

A main current wiring 6 is provided on the on-chip bonding material 13, and the main current wiring 6 and the on-chip bonding material 13 are electrically connected.

As illustrated in FIG. 2, the gate pad 8 is provided on a surface of the IGBT chip 1 without being in contact with the emitter electrode 3, and the emitter sense pad 9 is provided on a surface of the IGBT chip 1 without being in contact with the gate pad 8 and the emitter electrode 3. The gate pad 8 and the emitter sense pad 9 are provided in an end portion region on the −X direction side of the IGBT chip 1.

Each of the gate pad 8 and the emitter sense pad 9 has a rectangular shape in which a length in the Y direction is slightly longer than a length in the X direction in plan view.

The gate pad 8 is electrically connected to a gate electrode of the IGBT via a gate wiring (not illustrated), and is electrically connected to an external gate control terminal (not illustrated) via a gate control wire (not illustrated). The gate electrode of the IGBT corresponds to the "control electrode of a switching element".

The emitter sense wiring 10 is provided on a surface of the IGBT chip 1 and functions as a sense wiring that electrically connects the emitter electrode 3 and the emitter sense pad 9. Specifically, the emitter sense wiring 10 is provided to extend in the +X direction from the emitter sense pad 9, and is in contact with the emitter electrode 3 at a sense connection point 25 which is a side surface of the main current wiring connection region 11 as illustrated in FIG. 2.

The emitter electrode 3 is provided with a notched region extending in the X direction in a manner not to be in contact with the emitter sense wiring 10 in a location other than the sense connection point 25.

As illustrated in the upper diagram of FIG. 1, the emitter sense pad 9 is electrically connected to a control terminal 2 via a control wire 7. Specifically, by bonding one tip of the control wire 7 to a surface of the emitter sense pad 9, it is possible to electrically connect the emitter sense pad 9 and the control terminal 2.

Similarly to the control wire 7, the gate control wire is bonded onto a surface of the gate pad 8. Note that Al or the like is used as a constituent material of the control wire 7 or the gate control wire.

As described above, the control terminal 2 for the emitter electrode 3 and the gate control terminal exist as a control terminal of the IGBT which is a switching element in the IGBT chip 1.

The main current wiring 6 is electrically connected to the main current wiring 5 via the on-chip bonding material 13, the emitter electrode 3, the IGBT in the IGBT chip 1, the collector electrode 4, and the sub-chip bonding material 17.

Therefore, in the semiconductor device 51 of the first embodiment, main current flows as collector current from the main current wiring 5 to the main current wiring 6 during operation of the IGBT in the TORT chip 1. The main current wirings 5 and 6 are external wirings for extracting main current flowing through the IGBT. A current path IP1 illustrated in FIGS. 1 and 2 illustrates current flow in main current.

In the semiconductor device 51, the emitter electrode 3, the emitter sense pad 9, and the emitter sense wiring 10 are integrally formed on a surface of the IGBT chip 1.

On the other hand, as illustrated in FIGS. 1 and 2, in the IGBT chip 1, constituent elements of the IGBT are not formed in an ineffective region 20 below the emitter sense pad 9 and the emitter sense wiring 10. The ineffective region 20 is a region where the IGBT as a switching element does not function. Note that a field insulating film for element isolation may be formed as the ineffective region 20.

Further, a region below the gate pad 8 in the IGBT chip 1 is also the ineffective region 20 where the IGBT does not function.

FIG. 3 is a circuit diagram illustrating an equivalent circuit of the semiconductor device 51 illustrated in FIGS. 1 and 2. In FIG. 3, a resistance component of the emitter electrode 3 is considered. Further, in FIG. 3, the gate pad 8 is indicated by "G", and the emitter sense pad 9 is indicated by "Es".

Actually, a resistance component of the emitter electrode 3 is distributed in all the emitter electrodes 3 except for the main current wiring connection region 11 bonded to the lower surface S13 of the on-chip bonding material 13, but for simplification, in FIG. 3, the resistance component is considered as an emitter electrode resistance component R1 with a lumped constant. That is, the IGBTs in the IGBT chip 1 are classified into two, the IGBT in which collector current Ic2 flows in the main current wiring connection region 11 and the vicinity of the main current wiring connection region 11 is the IGBT 62, and the IGBT in which collector current Ic1 flows in an outer peripheral region of the emitter electrode 3 away from the main current wiring connection region 11 is the IGBT 61. This outer peripheral region is a surface electrode remote region.

Therefore, as illustrated in FIG. 3, the collectors of the IGBTs 61 and 62 are connected in common to the sub-chip bonding material 17, and the gates which are control electrodes of the IGBTs 61 and 62 are connected in common to the gate pad 8.

On the other hand, the emitter and the emitter sense pad 9 of the IGBT 62 are electrically connected to the main current wiring connection region 11. At this time, the emitter electrode resistance component R1 exists between the emitter of the IGBT 61 and the emitter of the IGBT 61.

In the emitter electrode 3, the emitter electrode resistance component R1 is a resistance component based on a distance from the lower surface S13 of the on-chip bonding material 13, that is, a distance from the main current wiring connection region 11 to the surface electrode remote region of the emitter electrode 3. Therefore, the emitter of the IGBT 61 is connected to the main current wiring connection region 11 via the emitter electrode resistance component R1.

In the semiconductor device 51 having such an equivalent circuit, the gate voltage VGE2 is applied between the gate pad 8 and the emitter sense pad 9 to bring the IGBT in the IGBT chip 1 into an operating state. Here, potential obtained from the emitter sense pad 9 is control reference potential.

That is, the IGBT has the gate which is a control electrode, and the operation of the IGBT is controlled by applying the gate voltage VGE2 which is control voltage with potential of the emitter electrode 3 as reference potential to the gate of the IGBT. As described above, in the semiconductor device 51, the gate voltage VGE2 becomes control voltage for the IGBT.

When the IGBT in the IGBT chip 1 is in an on state, the collector current Ic1 flows through the IGBT 61, and the collector current Ic2 flows through the IGBT 62. The sum of the collector current Ic1 and the collector current Ic2 is main current of the IGBT.

On the other hand, since the IGBT chip 1 has the ineffective region 20 below the emitter sense pad 9 and the emitter sense wiring 10, emitter potential of the IGBT 62 is not affected by main current.

By forming the emitter sense pad 9 and the emitter sense wiring 10 on the ineffective region 20, main current does not flow through the emitter sense wiring 10, and charge/discharge current mainly flows through the gate of the IGBT. Since charge/discharge current of the gate has a current amount smaller than main current by two or three orders of magnitude, voltage drop due to current flowing through the emitter sense wiring 10 becomes a negligible level, and as a result, control reference potential, which is potential of the emitter sense pad 9, is not affected by the main current.

Since the emitter electrode resistance component R1 exists between the emitters of the IGBTs 61 and 62, voltage drop due to the emitter electrode resistance component R1 occurs between the IGBTs 61 and 62. The semiconductor device 51 has a reference potential increase characteristic in which emitter potential of the IGBT 61 becomes relatively higher than emitter potential of the IGBT 62 due to the voltage drop. This reference potential increase characteristic corresponds to the "reference potential fluctuation characteristic".

That is, remote region reference potential in a surface electrode remote region relatively away from the main current wiring connection region 11 is affected by the emitter electrode resistance component R1 based on a distance from the main current wiring connection region 11, and has a reference potential increase characteristic higher than control reference potential.

As a result, as shown in Equation (2), the gate voltage VGE1 of the IGBT 61 becomes lower than the gate voltage VGE2.

$$VGE1 = VGE2 - R1 \cdot Ic1 \quad (2)$$

In Equation (2), "R1" is used as a resistance value of the emitter electrode resistance component R1, and "Ic1" is used as a current value of the collector current Ic1.

As shown in Equation (2), emitter potential of the IGBT 61 increases by (R1·Ic1) due to a reference potential increase characteristic, so that the gate voltage VGE1 of the IGBT 61 becomes lower than the gate voltage VGE2. As a result, the collector current Ic1 flowing through the IGBT 61 can be reduced.

As described above, the IGBT 61 has a reference potential increase characteristic based on potential distribution in a plane of the emitter electrode 3. In particular, when large current flows through the IGBT due to a short circuit or the like, this reference potential increase characteristic becomes remarkable.

Therefore, when large current is about to flow through the IGBT due to a short circuit or the like, the collector current Ic1 flowing through the IGBT 61 decreases due to the reference potential increase characteristic, so that increase in main current of the IGBT can be effectively suppressed.

As described above, in the semiconductor device 51, by applying negative feedback to the gate voltage VGE1 of the IGBT 61 by the emitter electrode resistance component R1 at the time of large current energization of a short circuit or the like, increase in main current can be effectively suppressed, and reliability of the device can be improved.

That is, in the semiconductor device 51, even when large current of a short circuit or the like flows and the collector current Ic2 increases, current control is performed so that the collector current Ic1 decreases, and (Ic1+Ic2), which is the total amount of collector current, is suppressed, so that reliability of the device can be improved.

Then, a value of the emitter electrode resistance component R1 can be optionally adjusted by designing the dimension of the opening region OP12 of the insulating film 12. For example, if a surface area of the main current wiring connection region 11 is reduced by reduction in the dimension of the opening region OP12, the emitter electrode resistance component R1 is increased, and the reference potential increase characteristic can be enhanced.

However, although the emitter electrode resistance component R1 is minute, a power loss occurs. For this reason, in application to an actual semiconductor device, it is necessary to appropriately design the dimension of the opening region OP12 in consideration of a trade-off between degree of a current amount reduction tendency of the collector current Ic1 and increase in power loss.

On the other hand, in a case where the emitter electrode 3 and the on-chip bonding material 13 are electrically connected only in a partial region of a surface of the main current wiring connection region 11, magnitude of the emitter electrode resistance component R1 changes depending on an area in contact with the on-chip bonding material 13 in a surface region of the main current wiring connection region 11. For this reason, optimum design becomes difficult.

In view of the above, in the semiconductor device 51 of the first embodiment, a surface shape of the lower surface S13 of the on-chip bonding material 13 is matched with a surface shape of the main current wiring connection region 11, and the entire region of a surface of the main current wiring connection region 11 and the lower surface S13 of the on-chip bonding material 13 are bonded.

That is, the semiconductor device 51 realizes the entire surface bonding structure in which the entire region of a surface of the main current wiring connection region 11 existing in the opening region OP12 of the insulating film 12 and the lower surface S13 of the on-chip bonding material 13 are brought into contact with each other to achieve electrical connection between the emitter electrode 3 and the on-chip bonding material 13.

For this reason, in the semiconductor device 51 of the first embodiment, the emitter electrode resistance component R1 can be accurately set according to the dimension of the opening region OP12.

In order to realize the entire surface bonding structure described above, it is desirable to reliably provide the on-chip bonding material 13 in the opening region OP12 of the insulating film 12 without a gap at the time of assembling the semiconductor device 51. For this reason, in the first embodiment, a surface shape of the lower surface S13 of the on-chip bonding material 13 matches a surface of the main current wiring connection region 11.

For example, when solder is used as the on-chip bonding material 13, the on-chip bonding material 13 having the lower surface S13 in contact with the entire surface of the main current wiring connection region 11 can be obtained by plating the inside of the opening region OP12 of the insulating film 12 and embedding the on-chip bonding material 13 in the opening region OP12 without a gap.

As described above, the semiconductor device 51 according to the first embodiment has features (1) to (3) below.
(1) The lower surface S13 of the on-chip bonding material 13 has a shape matching a surface shape of the main current wiring connection region 11 in plan view.
(2) The emitter sense wiring 10 is directly connected to a side surface of the main current wiring connection region 11.
(3) The IGBT chip 1 has the ineffective region 20 in which the IGBT does not function in a region below the emitter sense pad 9 and the emitter sense wiring 10.

Note that, regarding the above-described features (1) to (3), the on-chip bonding material 13 corresponds to the "chip bonding material", the main current wiring connection region 11 corresponds to the "wiring connection region", the emitter sense wiring 10 corresponds to the "sense wiring", the IGBT chip 1 corresponds to the "semiconductor chip", the emitter sense pad 9 corresponds to the "sense pad", and the IGBT corresponds to the "switching element".

Since the semiconductor device 51 of the first embodiment has the above-described features (1) to (3), control reference potential obtained from the emitter sense pad 9 during operation of the IGBT is not affected by the emitter electrode resistance component R1 based on a distance from the main current wiring connection region 11.

Therefore, assuming that a voltage value of original gate-emitter voltage in the IGBT in the IGBT chip 1 is a control voltage value VG0, the gate voltage VGE2 is equal to the control voltage value VG0.

On the other hand, in the emitter electrode 3 of the semiconductor device 51, emitter potential of the IGBT 61 is affected by the emitter electrode resistance component R1 based on a distance from the main current wiring connection region 11, and has a reference potential increase characteristic higher than emitter potential of the IGBT 62.

Therefore, the gate voltage VGE1 of the IGBT 61 is lower than the gate voltage VGE2 as shown in Equation (2) described above.

Here, emitter potential of the IGBT 61 corresponds to the "remote region reference potential" in a surface electrode remote region relatively away from the main current wiring connection region 11, emitter potential of the IGBT 62 corresponds to the control reference potential obtained from the emitter sense pad 9, and the "reference potential increase characteristic" corresponds to the "reference potential fluctuation characteristic".

Therefore, in the semiconductor device 51 according to the first embodiment, when large current flows as main current flowing through the emitter electrode 3 at the time of a short circuit or the like, a current amount of the collector current Ic1 flowing through a surface electrode remote region can be reduced according to the reference potential increasing characteristic.

As a result, the semiconductor device 51 of the first embodiment can effectively suppress increase in a current amount of main current of the IGBT by reduction in the collector current Ic1, and improve reliability of the device.

Note that, regarding the above-described effect of the first embodiment, the emitter electrode 3 corresponds to the "surface electrode". Further, in a case where the IGBTs in the IGBT chip 1 are classified into the IGBTs 61 and 62, the gate voltage VGE2 corresponds to the "control voltage" for the IGBT 62, and the gate voltage VGE1 corresponds to the "control voltage" for the IGBT 61.

Second Embodiment

Figure 4:
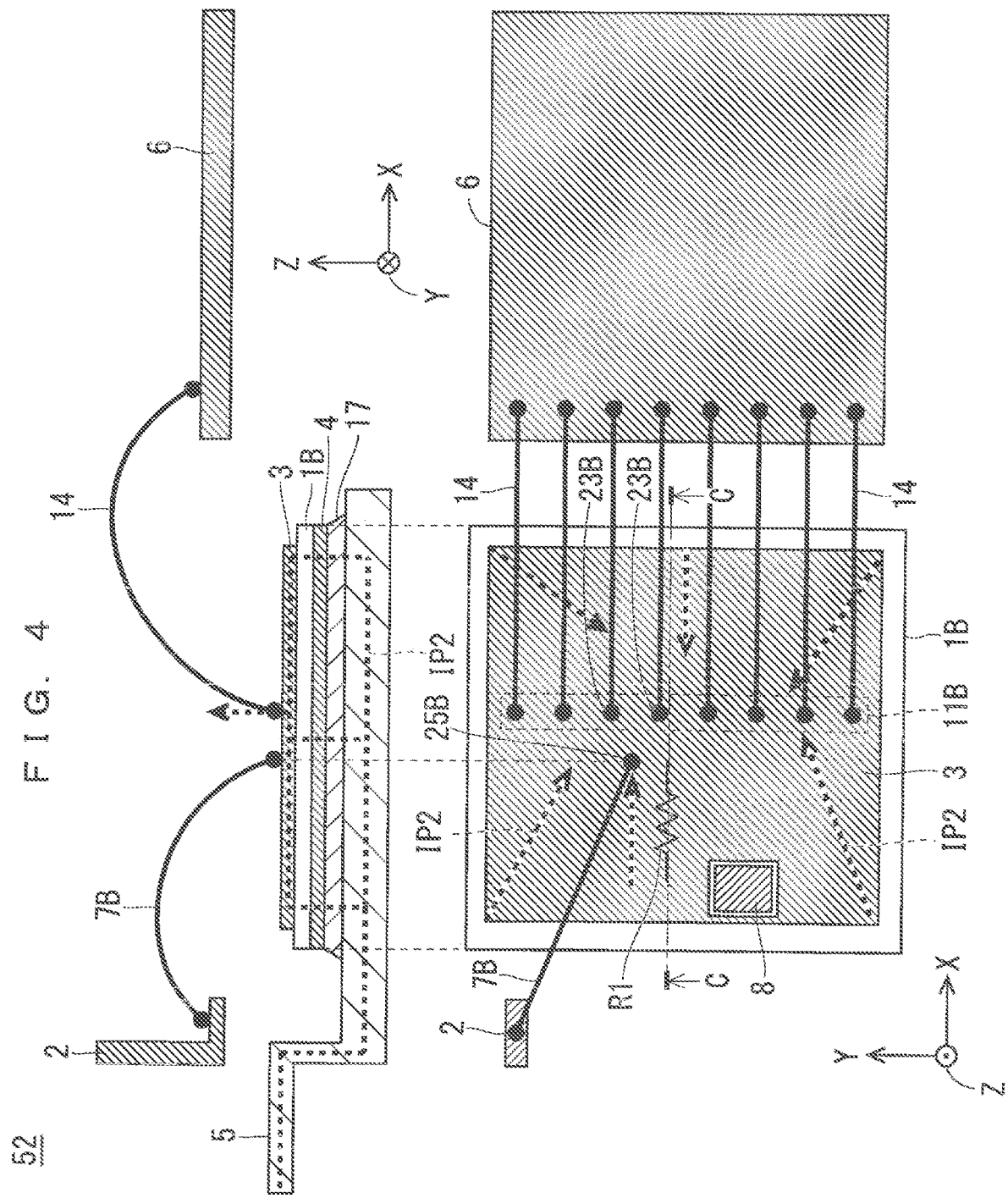
FIG. 4 is an explanatory diagram illustrating a structure of the semiconductor device according to a second embodiment.

FIG. 4 is an explanatory diagram illustrating a structure of a semiconductor device 52 according to a second embodiment of the present disclosure. The upper diagram of FIG. 4 is a cross-sectional view, and the lower diagram is a plan view. A cross section taken along line C-C of the lower diagram of FIG. 4 is the upper diagram of FIG. 4, and an XYZ orthogonal coordinate system is described in each of the upper diagram and the lower diagram of FIG. 4.

In the semiconductor device 52 illustrated in FIG. 4, an IGBT is used as a switching element, and an IGBT chip 1B which is a semiconductor chip having the IGBT in the inside is packaged.

As illustrated in FIG. 4, the emitter electrode 3 is provided on a front surface of the IGBT chip 1B, and the collector electrode 4 is provided on a back surface. The collector electrode 4 serving as a back surface electrode is electrically connected to the main current wiring 5 via the sub-chip bonding material 17.

One end of each of a plurality of main current wires 14 is electrically connected to the emitter electrode 3 by contacting at a corresponding chip connection point 23B among a plurality of the chip connection points 23B on a surface of the emitter electrode 3. A plurality of there chip connection points 23B are discretely provided near the center in the X direction along the Y direction. In this manner, one end of each of plurality of the main current wires 14 is bonded on a surface of the emitter electrode 3. The other end of a plurality of the main current wires 14 is bonded on a surface of the main current wiring 6. A plurality of the main current wires 14 correspond to the "plurality of chip wires".

One end of a control wire 7B is electrically connected to the emitter electrode 3 by contacting at a sense connection point 25B on a surface of the emitter electrode 3. That is, one end of the control wire 7B is bonded on a surface of the emitter electrode 3.

Further, as illustrated in the lower diagram of FIG. 4, the sense connection point 25B is provided near the third and fourth chip connection points 23B from the +Y direction side among a plurality of the chip connection points 23B. Note that the control wire 7B and a plurality of the main current wires 14 are provided in an electrically independent manner without being in contact with each other. The other end of the control wire 7B is bonded to the control terminal 2.

Here, a region including a plurality of the chip connection points 23B in the emitter electrode 3 is defined as the main current wiring connection region 11B, and a position farthest from the main current wiring connection region 11B in the emitter electrode 3 is defined as an electrode remote position. In the emitter electrode 3 illustrated in FIG. 4, an outer peripheral surface on the −X side is at the electrode remote position. Note that the emitter electrode 3 corresponds to the "surface electrode", and the main current wiring connection region 11B corresponds to the "wiring connection region".

The sense connection point 25B satisfies a connection point arrangement condition that the connection point is provided at a position close to the chip connection point 23B between the chip connection point 23B and the electrode remote position.

The sense connection point 25B only needs to satisfy the connection point arrangement condition in a relationship with at least one of a plurality of the main current wires 14. Further, potential obtained from the sense connection point 25B is the control reference potential.

As illustrated in FIG. 4, the gate pad 8 is provided on a surface of the IGBT chip 1B without being in contact with the emitter electrode 3. The gate pad 8 is provided in an end portion region on the −X direction side of the IGBT chip 1B. The gate pad 8 has a rectangular shape in which a length in the Y direction is slightly longer than a length in the X direction in plan view. Further, a region below the gate pad 8 in the IGBT chip 1B is an ineffective region where the IGBT does not function.

The gate pad 8 is electrically connected to a gate electrode of the IGBT via a gate wiring (not illustrated), and is electrically connected to a gate control terminal (not illustrated) via a gate control wire (not illustrated).

The gate control wire is bonded onto a surface of the gate pad 8. Note that Al or the like is used as a constituent material of the control wire 7B, the main current wire 14, and the gate control wire.

As described above, similarly to the first embodiment, the second embodiment includes the control terminal 2 for the emitter electrode 3 and the gate control terminal as a control terminal of the 16137 which is a switching element in the IGBT chip 1B.

The main current wiring 6 is electrically connected to the main current wiring 5 via a plurality of the main current wires 14, the emitter electrode 3, the IGBT in the IGBT chip 1B, the collector electrode 4, and the sub-chip bonding material 17.

Therefore, re, in the semiconductor device 52 of the second embodiment, main current flows as collector current from the main current wiring 5 to the main current wiring 6 during operation of the IGBT in the IGBT chip 1B. The main current wirings 5 and 6 are external wirings for extracting main current flowing through the IGBT. A current path IP2 illustrated in FIG. 4 indicates current flow in the main current.

The semiconductor device S2 of the second embodiment appears in an equivalent circuit illustrated in FIG. 3 as in the first embodiment. However, the main current wiring connection region 11 illustrated in FIG. 3 is replaced with the main current wiring connection region 11B, and the emitter sense pad 9 is replaced with the sense connection point 25B.

That is, regarding the IGBTs in the IGBT chip 1B, the IGBT in which collector current Ic2 flows in the main current wiring connection region 11B and the vicinity of the main current wiring connection region 11B is the IGBT 62, and the IGBT in which collector current Ic1 flows in an outer peripheral region of the emitter electrode 3 away from the main current wiring connection region 11B is the IGBT 61. This outer peripheral region is a surface electrode remote region.

Note that, in order to make the equivalent circuit of the semiconductor device 52 as a circuit illustrated in FIG. 3, it is desirable to arrange the sense connection point 25B close to any of a plurality of the chip connection points 23B. That is, it is desirable to arrange the sense connection point 25B close to any of a plurality of the chip connection points 23B to an extent that a resistance component between the sense connection point 25B and the main current wiring connection region 11B can be ignored.

Therefore, similarly to the semiconductor device 51, the semiconductor device 52 of the second embodiment can effectively suppress increase in main current and improve reliability of the device by applying negative feedback to the gate voltage VGE1 of the IGBT 61 by the reference potential increase characteristic of the IGBT 61 at the time of large current energization of a short circuit or the like.

As described above, the semiconductor device 52 according to the second embodiment has a feature (4) below.

(4) The sense connection point 25B of the control wire 7B satisfies a connection point arrangement condition that the connection point is provided at a position close to the chip connection point 23B between the chip connection point 23B and the electrode remote position in the emitter electrode 3.

Note that regarding the above-described feature (4), the control wire 7B corresponds to the "sense connection member" or the "sense wire", and the emitter electrode 3 corresponds to the "surface electrode".

The semiconductor device 52 according to the second embodiment has the above-described feature (4). Therefore, in the semiconductor device 52, by arranging the sense connection point 25B close to one connection point among a plurality of the chip connection points 23B, control reference potential obtained from the sense connection point 25B is hardly affected by the emitter electrode resistance component R1 based on a distance from the main current wiring connection region 11B during operation of the IGBT.

Therefore, assuming that a voltage value of original gate-emitter voltage in the IGBT in the IGBT chip 1B is the control voltage value VG0, the gate voltage VGE2 is equal to the control voltage value VG0.

On the other hand, in the emitter electrode 3 of the semiconductor device 52, emitter potential of the IGBT 61 is affected by the emitter electrode resistance component R1 based on a distance from the main current wiring connection region 11B, and has a reference potential increase characteristic higher than emitter potential of the IGBT 62.

Therefore, the gate voltage VGE1 of the IGBT 61 is lower than the gate voltage VGE2 as shown in Equation (2) described above.

Here, the emitter potential of the IGBT 61 corresponds to the "remote region reference potential" in a surface electrode remote region relatively away from a wire connection region.

Therefore, in the semiconductor device 52 according to the second embodiment, when large current flows as main current flowing through the emitter electrode 3 at the time of a short circuit or the like, a current amount of the collector current Ic1 flowing through a surface electrode remote region can be reduced according to the reference potential increasing characteristic of the IGBT 61.

As a result, the semiconductor device 52 of the second embodiment can effectively suppress increase in a current amount of main current of the IGBT by reduction in the collector current Ic1, and improve reliability of the device.

Furthermore, in the semiconductor device 52 according to the second embodiment, electrical connection between the sense connection point 25B of the emitter electrode 3 and the control terminal 2 can be relatively easily achieved by the control wire 7B.

In addition, in the semiconductor device 52 according to the second embodiment, relatively large main current can be taken out to the outside by establishing electrical connection with the emitter electrode 3 by a plurality of the main current wires 14.

Note that, regarding the above-described effect of the second embodiment, the emitter electrode 3 corresponds to the "surface electrode". Further, in a case where the IGBTs in the IGBT chip 1 are classified into the IGBTs 61 and 62, the gate voltage VGE2 corresponds to the "control voltage" for the IGBT 62, and the gate voltage VGE1 corresponds to the "control voltage" for the IGBT 61. Furthermore, the control wire 7B corresponds to the "sense bonding member" or the "sense wire", and the main current wire 14 corresponds to the "chip wire".

The sense connection point 25B of the control wire 7B can exhibit the above effect by satisfying the above-described connection point arrangement condition.

However, when the semiconductor device 52 of the second embodiment exerts the above effect, it is desirable that the sense connection point 25B be as close as possible to any of a plurality of the chip connection points 23B. This is because the emitter electrode resistance component R1 of the emitter electrode 3 can be increased to enhance the effect of suppressing a current amount of main current.

Furthermore, the sense connection point 25B is desirably close to a connection point existing at the center of the emitter electrode 3 among a plurality of the chip connection points 23B.

This is because, on the emitter electrode 3, a potential difference between the sense connection point 25B and each of the chip connection points 23B existing at both ends in the Y direction can be minimized.

Third Embodiment

Figure 5:
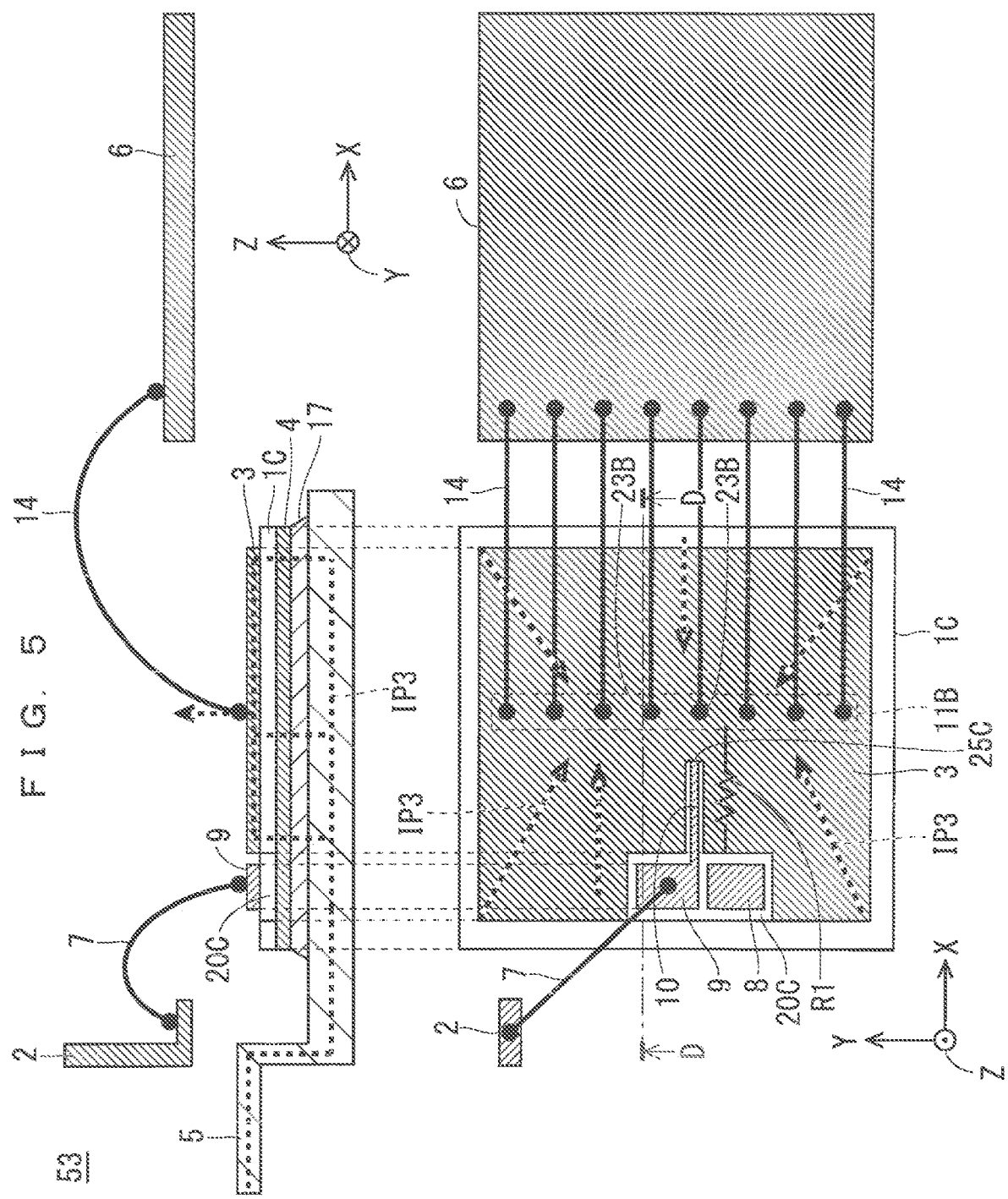
FIG. 5 is an explanatory diagram illustrating a structure of the semiconductor device according to a third embodiment.

FIG. 5 is an explanatory diagram illustrating a structure of a semiconductor device 53 according to a third embodiment of the present disclosure. The upper diagram of FIG. 5 is a cross-sectional view, and the lower diagram is a plan view. A cross section taken along line D-D of the lower diagram of FIG. 5 is the upper diagram of FIG. 5, and an XYZ orthogonal coordinate system is described in each of the upper diagram and the lower diagram of FIG. 5.

In the semiconductor device 53 illustrated in FIG. 5, an IGBT is used as a switching element, and an IGBT chip 1C which is a semiconductor chip having the IGBT in the inside is packaged. Hereinafter, the same portions as those of the semiconductor device 52 illustrated in FIG. 4 will be denoted by the same reference numerals and omitted from description as appropriate, and a feature portion of the semiconductor device 53 will be mainly described.

As illustrated in FIG. 5, the gate pad 8 is provided on a surface of the IGBT chip 1C without being in contact with the emitter electrode 3, and the emitter sense pad 9 is provided on a surface of the IGBT chip 1C without being in contact with the gate pad 8 and the emitter electrode 3. The gate pad 8 and the emitter sense pad 9 are provided in an end portion region on the −X direction side of the IGBT chip 1C.

Each of the gate pad 8 and the emitter sense pad 9 has a rectangular shape in which a length in the Y direction is slightly longer than a length in the X direction in plan view.

The gate pad 8 is electrically connected to a gate electrode of the IGBT via a gate wiring (not illustrated), and is electrically connected to a gate control terminal (not illustrated) via a gate control wire (not illustrated).

The emitter sense wiring 10 is provided on a surface of the IGBT chip 1C and is a sense wiring that electrically connects the emitter electrode 3 and the emitter sense pad 9. Specifically, the emitter sense wiring 10 is provided to extend in the +X direction from the emitter sense pad 9, and is in direct contact with the emitter electrode 3 at a sense connection point 25C which is a side surface of the main current wiring connection region 11.

The emitter electrode 3 is provided with a notched region extending in the X direction in a manner not to be in contact with the emitter sense wiring 10 in a location other than the sense connection point 25C.

The sense connection point 25C satisfies a connection point arrangement condition that the connection point is provided at a position close to the chip connection point 23B between the chip connection point 23B and the electrode remote position in the emitter electrode 3.

The sense connection point 25C only needs to satisfy the connection point arrangement condition in a relationship with at least one of a plurality of the main current wires 14.

As illustrated in the lower diagram of FIG. 5, the sense connection point 25C is provided near the fifth chip connection points 23B from the +Y direction side among a plurality of the chip connection points 23B, and satisfies the connection point arrangement condition.

As illustrated in the upper diagram of FIG. 5, the emitter sense pad 9 is electrically connected to the control terminal 2 via the control wire 7. Specifically, by bonding a tip of the control wire 7 to a surface of the emitter sense pad 9, it is possible to electrically connect the emitter sense pad 9 and the control terminal 2.

Note that Al or the like is used as a constituent material of the control wire 7, the main current wire 14, and the gate control wire.

Furthermore, in the IGBT chip 1C, constituent elements of the IGBT are not formed in an ineffective region 20C below the emitter sense pad 9 and the emitter sense wiring 10. The ineffective region 20C is a region where the IGBT as a switching element does not function.

Furthermore, a region below the gate pad 8 in the IGBT chip 1C is also the ineffective region 20C where the IGBT does not function.

As described above, similarly to the first and second embodiments, the third embodiment includes the control terminal 2 for the emitter electrode 3 and the gate control terminal as a control terminal of the IGBT which is a switching element in the IGBT chip 1C.

The main current wiring 6 is electrically connected to the main current wiring 5 via a plurality of the main current wires 14, the emitter electrode 3, the IGBT in the IGBT chip 1C, the collector electrode 4, and the sub-chip bonding material 17.

Therefore, in the semiconductor device 53 of the third embodiment, main current flows as collector current from the main current wiring 5 to the main current wiring 6 during operation of the IGBT in the IGBT chip 1C. The main current wirings 5 and 6 are external wirings for extracting main current flowing through the IGBT. A current path IP3 illustrated in FIG. 5 indicates current flow in the main current.

The semiconductor device 53 of the third embodiment appears in the equivalent circuit illustrated in FIG. 3 as in the first and second embodiments. However, the main current wiring connection region 11 illustrated in FIG. 3 is replaced with the main current wiring connection region 11B.

Therefore, in the semiconductor device 53 of the third embodiment, reliability of the device can be improved similarly to the semiconductor device 51 and the second embodiment.

The semiconductor device 53 according to the third embodiment further has an effect described below. In the semiconductor device 52 of the second embodiment, in order to avoid interference between the control wire 7B and a plurality of the main current wires 14, it is necessary to set a distance between the sense connection point 25B of the control wire 7B and the chip connection point 23B of the main current wire 14 to a certain distance or more.

On the other hand, in the third embodiment, as the sense connection member, the gate pad 8 and the emitter sense pad 9 are used instead of the control wire 7B. Therefore, in the semiconductor device 53, since no interference occurs even if the sense connection point 25C is brought close to the chip connection point 23B, a distance between the chip connection point 23B and the sense connection point 25C is shortened, the emitter electrode resistance component R1 is increased, and a current amount suppression effect of main current can be enhanced.

As described above, in the semiconductor device 53 according to the third embodiment, the emitter sense wiring 10 is connected at the sense connection point 25C relatively close to the chip connection point 23B, so that electrical connection to the emitter electrode 3 can be achieved in a stable manner.

In addition, since the IGBT chip 1C has the ineffective region 20C in which the IGBT does not function in a region below the emitter sense pad 9 and the emitter sense wiring 10, emitter potential of the IGBT 62 is not affected by main current in the equivalent circuit illustrated in FIG. 3.

Note that, regarding the above-described effect of the third embodiment, the emitter sense wiring 10 corresponds to the "sense wiring", the emitter electrode 3 corresponds to the "surface electrode", the IGBT chip 1C corresponds to the "semiconductor chip", the emitter sense pad 9 corresponds to the "sense pad", the emitter sense wiring 10 corresponds to the "sense wiring", and the IGBT corresponds to the "switching element".

Further, emitter potential of the IGBT 62 is control reference potential obtained from the emitter sense pad 9.

Fourth Embodiment

Figure 6:
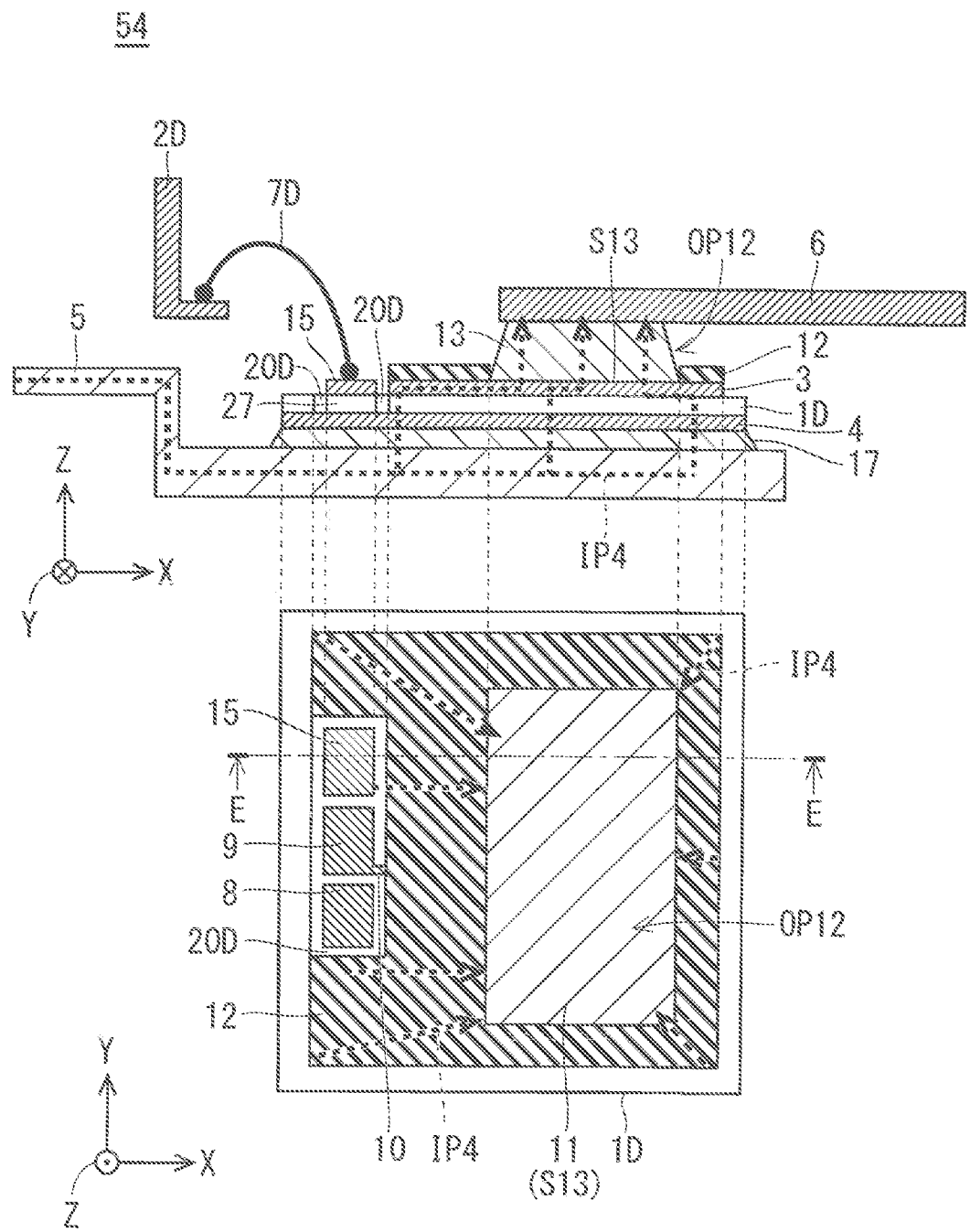
FIG. 6 is an explanatory diagram illustrating a structure of the semiconductor device according to a fourth embodiment.
Figure 7:
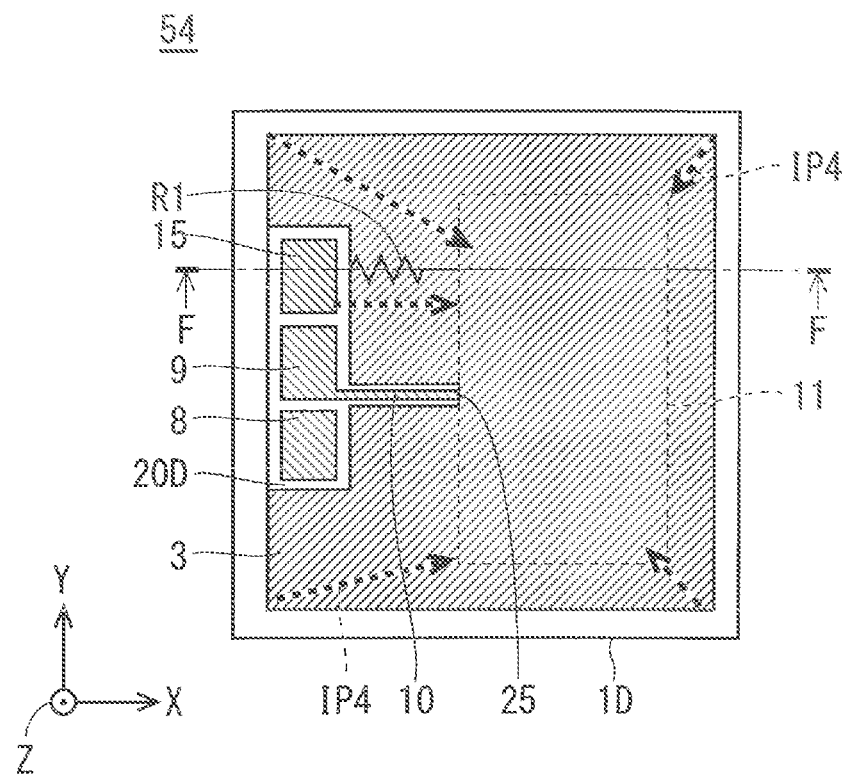
FIG. 7 is an explanatory diagram illustrating a structure of the semiconductor device according to a fourth embodiment.

FIGS. 6 and 7 are explanatory diagrams illustrating a structure of a semiconductor device 54 according to a fourth embodiment of the present disclosure. An upper diagram of FIG. 6 is a cross-sectional view, and a lower diagram is a plan view, and FIG. 7 is a plan view. A cross section taken along line E-E of the lower diagram of FIG. 6 is the upper diagram of FIG. 6, and a cross section taken along line F-F of FIG. 7 is also the upper diagram of FIG. 6. An XYZ orthogonal coordinate system is illustrated in the upper diagram and the lower diagram of FIG. 6, and FIG. 7.

The lower diagram of FIG. 6 is a plan view in which an uppermost part is the insulating film 12, and FIG. 7 is a plan view in which an uppermost part is the emitter electrode 3.

In the semiconductor device 54 illustrated in FIGS. 6 and 7, an IGBT is used as a switching element, and an IGBT chip 1D which is a semiconductor chip having the IGBT in the inside is packaged.

Hereinafter, the same portions as those of the semiconductor device 51 of the first embodiment illustrated in FIGS. 1 and 2 will be denoted by the same reference numerals and omitted from description as appropriate, and a feature portion of the semiconductor device 54 will be mainly described. A current path IP4 illustrated in FIGS. 6 and 7 illustrates current flow in main current.

The semiconductor device 54 according to the fourth embodiment has features (5) to (7) below in addition to the features (1) to (3) of the semiconductor device 51.

(5) The IGBT chip 1D further includes a current detection IGBT that performs switching operation equivalent to the original IGBT, and the current detection IGBT is provided in a current detection element formation region 27 of the IGBT chip 1D.

(6) A current detection output pad 15 which is provided on a surface of the current detection element formation region 27 of the IGBT chip 1D without being in contact with the emitter electrode 3 and through which detection current flows during operation of the current detection IGBT is further provided.

(7) Current obtained from the current detection output pad 15 is sense current Is.

Note that, regarding the above-described features (5) to (7), the IGBT chip 1D corresponds to the "semiconductor chip", the IGBT corresponds to the "switching element", the current detection IGBT corresponds to the "current detection element", the emitter electrode 3 corresponds to the "surface electrode", and the current detection output pad 15 corresponds to the "current detection pad".

Further, like in the first embodiment, constituent elements of the IGBT are not formed in an ineffective region 20D below the emitter sense pad 9 and the emitter sense wiring 10. The ineffective region 20D is a region where the IGBT as a switching element does not function.

Furthermore, a region below the gate pad 8 in the IGBT chip 1D is also the ineffective region 20D where the IGBT does not function.

In addition, in the IGBT chip 1D, the ineffective region 20D is also formed around the current detection element formation region 27. Since the ineffective region 20D functions as an element isolation region, the current detection IGBT in the current detection element formation region 27 is provided independently of the original IGBT below the emitter electrode 3.

The current detection output pad 15 is provided on the current detection element formation region 27 without being in contact with the emitter electrode 3, the gate pad 8, and the emitter sense pad 9, functions as an emitter electrode of the current detection IGBT, and is electrically connected to a control terminal 21) via a control wire 7D as illustrated in the upper diagram of FIG. 6. In this manner, the current detection output pad 15 is provided independently of the emitter electrode 3.

FIG. 8 is a circuit diagram illustrating an equivalent circuit of the semiconductor device 54 illustrated in FIGS. 6 and 7. In FIG. 8, a resistance component of the emitter electrode 3 is considered. Further, in FIG. 8, the gate pad 8 is indicated by "G", the emitter sense pad 9 is indicated by "Es", and the current detection output pad 15 is indicated by "S".

For simplification, in FIG. 8, the emitter electrode resistance component R1 is considered as a lumped constant.

That is, the IGBTs in the IGBT chip 1D are classified into two, the IGBT in which collector current Ic2 flows in the main current wiring connection region 11 and the vicinity of the main current wiring connection region 11 is the IGBT 62, and the IGBT in which collector current Ic1 flows in an outer peripheral region of the emitter electrode 3 away from the main current wiring connection region 11 is the IGBT 61. This outer peripheral region is a surface electrode remote region.

Figure 11:
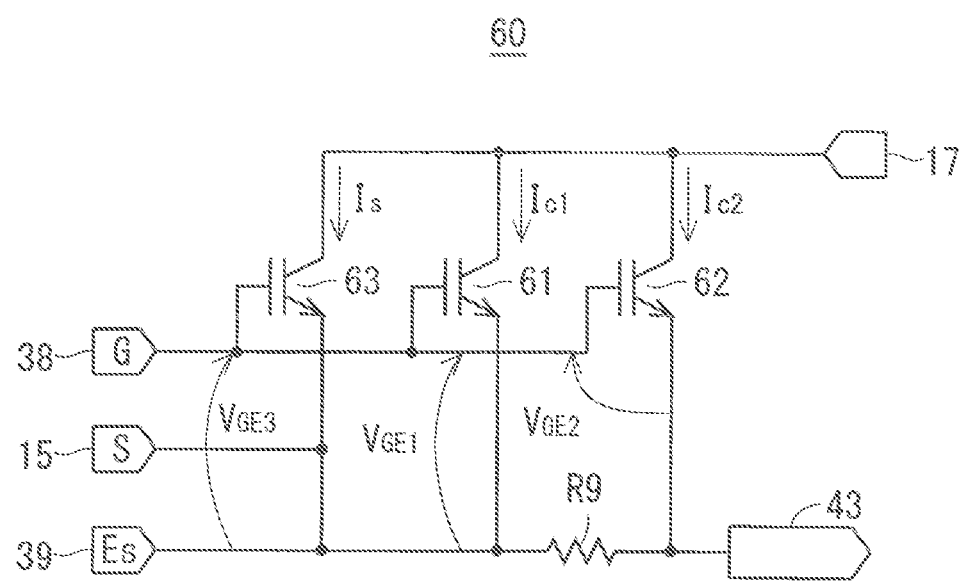
FIG. 11 is a circuit diagram illustrating an equivalent circuit of a semiconductor device for comparison.

FIG. 11 is a circuit diagram illustrating an equivalent circuit of a semiconductor device 59B for comparison having a current detection function similarly to the semiconductor device 54. The semiconductor device 59B has a configuration in which the current detection output pad 15 is added to the semiconductor device 59 of the basic technique illustrated in FIGS. 9 and 10. Further, in FIG. 11, the gate pad 38 is indicated by "G", the emitter sense pad 39 is indicated by "Es", and the current detection output pad 15 is indicated by "S".

In FIG. 11, the emitter electrode resistance component R9 is considered as a lumped constant. That is, the IGBTs in the IGBT chip 31 are classified into two, the IGBT in which the collector current Ic2 flows in the main current wiring connection region 41 and the vicinity of the main current wiring connection region 41 is the IGBT 62, and the IGBT in which the collector current Ic1 flows in the emitter sense pad 39 and in the vicinity of the emitter sense pad 39 is the IGBT 61.

Further, in both FIGS. 8 and 11, the current detection IGBT is an IGBT 63, the gate of the IGBT 63 is connected to the gate pad 8, and the emitter is connected to the current detection output pad 15 without passing through the emitter electrode resistance component R1 or R9. Here, current flowing through the IGBT 63 is referred to as the sense current Is.

Furthermore, the current detection output pad 15 and the emitter sense pad 9 or the emitter sense pad 39 are short-circuited to simplify the description.

Similarly to the equivalent circuit of the semiconductor device 59 illustrated in FIG. 10, the semiconductor device 59B is affected by the emitter electrode resistance component R9, and the collector current Ic2 of the IGBT 62 tends to increase.

On the other hand, both the gate voltage VGE1 of the IGBT 61 and gate voltage VGE3 of the IGBT 63 are not affected by the emitter electrode resistance component R9.

Therefore, assuming that a voltage value of original gate-emitter voltage in the IGBT in the IGBT chip 31 is the control voltage value VG0, both the gate voltage VGE1 and the gate voltage VGE3 are equal to the control voltage value VG0.

For this reason, in the semiconductor device 59B, the collector current Ic1 and the sense current Is are not affected by increase in the collector current Ic2.

That is, the semiconductor device 59B has a detection characteristic in which the collector current Ic1 can be accurately detected based on the sense current Is, but the collector current Ic2 cannot be accurately detected based on the sense current Is.

Therefore, in the semiconductor device 59B, in a case where main current (=Ic1+Ic2) of the IGBT increases, detection sensitivity of the main current by the sense current Is relatively decreases as much as increase in a current ratio of the collector current Ic2 in the main current.

On the other hand, similarly to the semiconductor device 51, the semiconductor device 54 of the fourth embodiment is affected by the emitter electrode resistance component R1, and the collector current Ic1 of the IGBT 61 tends to decrease.

On the other hand, similarly to the semiconductor device 51, the gate voltage VGE2 of the IGBT 62 is not affected by the emitter electrode resistance component R1 in the semiconductor device 54.

Furthermore, the gate voltage VGE3 of the IGBT 63 is also not affected by the emitter electrode resistance component R1. This is because the current detection element formation region 27 is below the current detection output pad 15, and the current detection output pad 15 can be formed to be relatively small, so that the gate voltage VGE3 during operation of the current detection IGBT is hardly affected by a resistance component of the current detection output pad 15.

Therefore, assuming that a voltage value of original gate-emitter voltage in the IGBT in the IGBT chip 1D is the control voltage value VG0, both the gate voltage VGE2 and the gate voltage VGE3 are equal to the control voltage value VG0.

For this reason, in the semiconductor device 54 of the fourth embodiment, the collector current Ic2 and the sense current Is are not affected by decrease in the collector current Ic1.

The semiconductor device 54 has a detection characteristic in which the collector current Ic2 can be accurately detected based on the sense current Is, but the collector current Ic1 cannot be accurately detected based on the sense current Is.

Therefore, in the semiconductor device 54 of the fourth embodiment, in a case where main current (=Ic1+Ic2) of the IGBT increases, as much as a current ratio of the collector current Ic1 in the main current decreases and a current ratio of the collector current Ic2 increases, detection sensitivity of the main current based on the sense current Is becomes relatively high.

In the semiconductor device 54 of the fourth embodiment, when the main current flows through the emitter electrode 3 of the IGBT, the gate voltage VGE1 becomes lower than the gate voltage VGE2, and a current amount of the collector current Ic1 flowing through the surface electrode remote region decreases.

On the other hand, since the gate voltage VGE1 and the gate voltage VGE3 are not affected by the emitter electrode resistance component R1, the collector current Ic2 and the sense current Is do not decrease even if the collector current Ic1 decreases.

As a result, in the main current flowing through the IGBT in the IGBT chip 1D, as much as a current amount of the collector current Ic1 flowing through the surface electrode remote region decreases and a ratio of the collector current Ic2 in the main current increases, detection sensitivity of the main current based on the sense current Is flowing through the current detection IGBT can be improved.

Regarding the effect of the fourth embodiment described above, the IGBT corresponds to the "switching element", and the emitter electrode 3 corresponds to the "surface electrode". Further, in a case where the original IGBTs in the IGBT chip 1D are classified into the IGBTs 61 and 62, the gate voltage VGE1 corresponds to the "control voltage" for the IGBT 61, and the gate voltage VGE2 corresponds to the "control voltage" for the IGBT 62. Furthermore, the current detection output pad 15 corresponds to the "current detection pad", and the gate voltage VGE3 corresponds to the "control voltage" for the IGBT 63.

Note that, as the semiconductor device 54 according to the fourth embodiment, a structure in which the current detection output pad 15, the current detection element formation region 27, and the like are added based on the semiconductor device 51 is described. The present invention is not limited to this structure, and a structure in which the current detection output pad 15, the current detection element formation region 27, and the like are added based on the semiconductor device 52 or the semiconductor device 53 may be employed as a variation. Also in a variation of the fourth embodiment, an effect unique to the fourth embodiment can be similarly exhibited.

Others

In the semiconductor devices 51 to 54 according to the first to fourth embodiments, an IGBT is used as a switching element. By using the IGBT as a switching element, an effect below is obtained. Hereinafter, the semiconductor device 51 of the first embodiment will be described as a representative.

The IGBT provided in the IGBT chip 1 of the semiconductor device 51 has a PN junction, and loss corresponding to rising voltage (1 VF≈0.7 V) is always generated at the time of energization. Here, "VF" means forward voltage of a diode, and loss of 1 VF occurs between the emitter electrode 3 and the collector electrode 4.

For this reason, even if loss occurs due to the minute emitter electrode resistance component R1 of the emitter electrode 3 which is a surface electrode, the above-described loss of 1 VF due to original rising voltage is dominant. Therefore, in the semiconductor device 51, even if the emitter electrode resistance component R1 is designed to be large, increase in loss is easily allowed, and reliability of the device can be further enhanced.

As described above, in a case where the IGBT is used as a switching element provided in the IGBT chip 1, the IGBT has a characteristic that rising voltage at the time of energization is hardly affected by loss due to the emitter electrode resistance component R1 of the emitter electrode 3, so that the semiconductor device 51 that is highly reliable can be obtained.

Note that another semiconductor element such as a MOSFET may be used as switching elements other than the IGBT. As a constituent material as a MOSFET, for example, silicon (Si) or silicon carbide (SiC) can be considered. Even in this case, the effect described in the first to fourth embodiments can be exhibited.

Further, a switching element typified by the IGBT is generally formed of silicon (Si), but as a variation, it is conceivable to form the switching element from a wide band gap semiconductor having a band gap larger than that of silicon. Examples of the wide band gap semiconductor include silicon carbide, a gallium nitride-based material, and diamond.

Hereinafter, as a semiconductor device having a switching element formed from a wide band gap semiconductor, a variation of the semiconductor device 51 of the first embodiment will be described as a representative.

In the variation of the semiconductor device 51, the IGBT is formed of a wide band gap semiconductor. Since the IGBT has high withstand voltage and high allowable current density, the IGBT can be downsized. Therefore, the variation of the semiconductor device 51 has an effect that downsizing of the device as a semiconductor module can be achieved as the downsized IGBT is provided in the IGBT chip 1.

Further, since the wide gap semiconductor has high heat resistance, it is possible to downsize a heat dissipation fin of a heat sink and to air-cool a water-cooled portion. For this reason, in the variation of the semiconductor device 51, it is possible to further downsize the semiconductor module.

As described above, the IGBT in the variation of the semiconductor device 51 is formed of the wide gap semiconductor. As described above, since the wide band gap semiconductor has characteristics of high withstand voltage, high allowable power density, and high heat resistance, downsizing of the device can be achieved in the variation of the semiconductor device 51.

Furthermore, since the wide gap semiconductor has low power loss, efficiency of an IGBT element can be improved, and therefore, efficiency of the semiconductor module including the IGBT can be improved. From the characteristics of high heat resistance and low loss as described above, it is easy to allow increase in loss deterioration due to the emitter electrode resistance component R1 of the emitter electrode 3.

As described above, the variation of the semiconductor device 51 can exhibit the various effects described above. Note that the IGBT in the above-described effect corresponds to the "switching element", the IGBT chip 1 corresponds to the "semiconductor chip", and the emitter electrode 3 corresponds to the "surface electrode".

Note that, as a matter of course, the switching elements represented by the IGBTs provided in the IGBT chips 1 and 1B to 1D can be applied to either a planar type or a trench type.

Further, in the present disclosure, the embodiments can be freely combined with each other, and each of the embodiments can be appropriately modified or omitted.

The invention claimed is:

1. A semiconductor device comprising:
a semiconductor chip having a switching element therein; and
a surface electrode provided on a surface of the semiconductor chip and through which main current flows during operation of the switching element, wherein
the switching element has a control electrode, and the switching element is operated and controlled by applying a control voltage with potential of the surface electrode as reference potential to the control electrode,
the semiconductor device further comprising:
an insulating film provided on the surface electrode, wherein
the insulating film has an opening region, and a region in the opening region in the surface electrode serves as a wiring connection region,
the semiconductor device further comprising:
a chip bonding material that has a lower surface and is electrically connected to the surface electrode by contacting the lower surface with a surface of the wiring connection region;
a sense pad provided independently of the surface electrode on a surface of the semiconductor chip; and
a sense wiring provided on a surface of the semiconductor chip and electrically connecting the surface electrode and the sense pad, wherein
potential of the sense pad is control reference potential of the switching element,
the lower surface of the chip bonding material has a shape matching a surface shape of the wiring connection region in plan view,
the sense wiring is connected to the wiring connection region, and the semiconductor chip has an ineffective region in which the switching element does not function in a region below the sense pad and the sense wiring.

2. The semiconductor device according to claim 1, wherein
the semiconductor chip further includes a current detection element that is provided independently of the switching element and performs switching operation equivalent to the switching element, and the current detection element is provided in a current detection element formation region of the semiconductor chip, and
the semiconductor device further includes
a current detection pad that is provided on the current detection element formation region of the semiconductor chip independently of the surface electrode and through which detection current flows during operation of the current detection element.

3. The semiconductor device according to claim 1, wherein
the switching element is an IGBT.

4. The semiconductor device according to claim 1, wherein
the switching element is formed of a wide band gap semiconductor.

5. A semiconductor device comprising:
a semiconductor chip having a switching element therein; and
a surface electrode provided on a surface of the semiconductor chip and through which main current flows during operation of the switching element, wherein
the switching element has a control electrode, and the switching element is operated and controlled by applying a control voltage with potential of the surface electrode as reference potential to the control electrode,
the semiconductor device further comprising:
a chip wire that is electrically connected to the surface electrode by contacting at a chip connection point on a surface of the surface electrode; and
a sense connection member that is electrically connected to the surface electrode by contacting at a sense connection point of the surface electrode, wherein
potential of the sense connection point is control reference potential of the switching element, a region including the chip connection point in the surface electrode is defined as a wiring connection region, and a position farthest from the wiring connection region in the surface electrode is defined as an electrode remote position,
the sense connection point satisfies a connection point arrangement condition that a connection point is provided at a position close to the chip connection point between the chip connection point and the electrode remote position,
the sense connection member includes:
a sense pad provided independently of the surface electrode on a surface of the semiconductor chip; and
a sense wiring provided on a surface of the semiconductor chip and electrically connecting the surface electrode and the sense pad,
the sense connection point exists on a side surface of the wiring connection region,
the sense wiring is electrically connected to the surface electrode by being in contact with the surface electrode at the sense connection point, and
the semiconductor chip has an ineffective region in which the switching element does not function in a region below the sense pad and the sense wiring.

6. The semiconductor device according to claim 5, wherein
the chip wire includes a plurality of chip wires, and
the sense connection point satisfies the connection point arrangement condition in a relationship with at least one chip wire among the plurality of chip wires.

* * * * *